United States Patent
Kroyzer et al.

(10) Patent No.: US 8,739,775 B2
(45) Date of Patent: Jun. 3, 2014

(54) DEVICES, METHODS, AND SYSTEMS FOR CONTROL OF HELIOSTATS

(75) Inventors: Gil Kroyzer, Jerusalem (IL); Rotem Hayut, Yavne (IL)

(73) Assignee: Brightsource Industries (Israel) Ltd., Jerusalem (IL)

( * ) Notice: Subject to any disclaimer, the term of this patent is extended or adjusted under 35 U.S.C. 154(b) by 856 days.

(21) Appl. No.: 12/867,552

(22) PCT Filed: Feb. 17, 2009

(86) PCT No.: PCT/US2009/034323
§ 371 (c)(1),
(2), (4) Date: Oct. 12, 2010

(87) PCT Pub. No.: WO2009/103077
PCT Pub. Date: Aug. 20, 2009

(65) Prior Publication Data
US 2011/0036343 A1    Feb. 17, 2011

Related U.S. Application Data

(60) Provisional application No. 61/028,525, filed on Feb. 14, 2008.

(51) Int. Cl.
*F24J 2/38* (2006.01)

(52) U.S. Cl.
USPC ............ 126/601; 126/574; 126/593; 126/599

(58) Field of Classification Search
USPC .................. 126/571–577, 593, 599, 600–603, 126/605–607
See application file for complete search history.

(56) References Cited

U.S. PATENT DOCUMENTS

| 811,274 A | 1/1906 | Carter |
| 2,999,943 A | 9/1961 | Willard |

(Continued)

FOREIGN PATENT DOCUMENTS

| DE | 10248068 | 5/2004 |
| EP | 0106688 | 3/1985 |

(Continued)

OTHER PUBLICATIONS

BCB Informatica y Control. Heliostat Calibration for Concentrating Solar Power Plants Using Machine Vision [online]. [retrieved on Nov. 17, 2009]. Retrieved from the Internet: <URL: http://bcb.es/documentos/descargar.php?id=29>.

(Continued)

*Primary Examiner* — Scott J Sugarman
*Assistant Examiner* — Robert E Tallman
(74) *Attorney, Agent, or Firm* — Miles & Stockbridge, P.C.; Mark A. Catan

(57) ABSTRACT

Adherence to flux or resultant measurable parameter limits, ranges, or patterns can be achieved by directing heliostat mounted mirrors to focus on aiming points designated on the surface of a solar receiver. Different heliostats can be directed to different aiming points, and a heliostat can be directed to different aiming points at different times. The cumulative flux distribution resulting from directing a plurality of heliostats to any aiming point on a receiver surface can be predicted by using statistical methods to calculate the expected beam projection for each individual heliostat or alternatively for a group of heliostats. Control of the heliostats in a solar power system can include designating aiming points on a receiver from time to time and assigning heliostats to aiming points from time to time in accordance with an optimization goal.

26 Claims, 5 Drawing Sheets

(56) References Cited

U.S. PATENT DOCUMENTS

| | | |
|---|---|---|
| 3,892,433 A | 7/1975 | Blake |
| 3,924,604 A | 12/1975 | Anderson |
| 4,034,735 A | 7/1977 | Waldrip |
| 4,044,753 A | 8/1977 | Fletcher et al. |
| 4,102,326 A | 7/1978 | Sommer |
| 4,117,682 A | 10/1978 | Smith |
| 4,146,785 A | 3/1979 | Neale |
| 4,172,443 A * | 10/1979 | Sommer .................. 126/680 |
| 4,219,729 A * | 8/1980 | Smith .................. 250/203.4 |
| 4,227,513 A | 10/1980 | Blake et al. |
| 4,245,618 A | 1/1981 | Wiener |
| 4,247,182 A | 1/1981 | Smith |
| 4,265,223 A | 5/1981 | Miserlis et al. |
| 4,283,887 A | 8/1981 | Horton et al. |
| 4,289,114 A | 9/1981 | Zadiraka |
| 4,297,521 A | 10/1981 | Johnson |
| 4,331,829 A | 5/1982 | Palazzetti et al. |
| 4,343,182 A | 8/1982 | Pompei |
| 4,365,618 A | 12/1982 | Jones |
| 4,438,630 A | 3/1984 | Rowe |
| 4,459,972 A | 7/1984 | Moore |
| 4,474,169 A | 10/1984 | Steutermann |
| 4,485,803 A | 12/1984 | Wiener |
| 4,490,981 A | 1/1985 | Meckler |
| 4,512,336 A | 4/1985 | Wiener |
| 4,564,275 A | 1/1986 | Stone |
| 4,633,854 A | 1/1987 | Mayrhofer |
| 4,913,129 A | 4/1990 | Kelly et al. |
| 5,128,799 A | 7/1992 | Byker |
| 5,417,052 A | 5/1995 | Bharathan et al. |
| 5,578,140 A | 11/1996 | Yogev et al. |
| 5,759,251 A | 6/1998 | Nakamura et al. |
| 5,861,947 A | 1/1999 | Neumann |
| 5,862,799 A | 1/1999 | Yogev et al. |
| 5,899,199 A | 5/1999 | Mills |
| 5,905,590 A | 5/1999 | Van Der Sluis et al. |
| 5,982,481 A | 11/1999 | Stone et al. |
| 6,080,927 A | 6/2000 | Johnson |
| 6,131,565 A | 10/2000 | Mills |
| 6,310,725 B1 | 10/2001 | Duine et al. |
| 6,597,709 B1 | 7/2003 | Diver, Jr. |
| 6,653,551 B2 | 11/2003 | Chen |
| 6,662,801 B2 | 12/2003 | Hayden et al. |
| 6,818,818 B2 | 11/2004 | Bareis |
| 6,899,097 B1 | 5/2005 | Mecham |
| 6,926,440 B2 | 8/2005 | Litwin |
| 6,957,536 B2 | 10/2005 | Litwin et al. |
| 6,959,993 B2 | 11/2005 | Gross et al. |
| 7,042,615 B2 | 5/2006 | Richardson |
| 7,191,597 B2 | 3/2007 | Goldman |
| 7,191,736 B2 | 3/2007 | Goldman |
| 7,207,327 B2 | 4/2007 | Litwin et al. |
| 7,296,410 B2 | 11/2007 | Litwin |
| 7,331,178 B2 | 2/2008 | Goldman |
| 7,340,899 B1 | 3/2008 | Rubak et al. |
| 7,523,921 B2 | 4/2009 | Garrity |
| 7,884,279 B2 | 2/2011 | Dold et al. |
| 8,001,960 B2 | 8/2011 | Gilon et al. |
| 8,033,110 B2 | 10/2011 | Gilon et al. |
| 2004/0086021 A1 | 5/2004 | Litwin |
| 2004/0231716 A1 | 11/2004 | Litwin |
| 2005/0126170 A1 | 6/2005 | Litwin |
| 2007/0084208 A1 | 4/2007 | Goldman |
| 2007/0157614 A1 | 7/2007 | Goldman |
| 2007/0157922 A1 | 7/2007 | Radhakrishnan et al. |
| 2007/0221208 A1 | 9/2007 | Goldman |
| 2007/0272234 A1 | 11/2007 | Allen et al. |
| 2008/0000436 A1 | 1/2008 | Goldman |
| 2008/0011288 A1 | 1/2008 | Olsson |
| 2008/0011290 A1 | 1/2008 | Goldman et al. |
| 2008/0293132 A1 | 11/2008 | Goldman et al. |
| 2008/0295883 A1 | 12/2008 | Ducellier et al. |
| 2008/0314438 A1 | 12/2008 | Tran et al. |
| 2009/0038608 A1 | 2/2009 | Caldwell |
| 2009/0056701 A1 | 3/2009 | Mills et al. |
| 2009/0107485 A1 | 4/2009 | Reznik et al. |
| 2009/0151769 A1 | 6/2009 | Corbin et al. |
| 2009/0178668 A1 | 7/2009 | Boggavarapu |
| 2009/0217921 A1 | 9/2009 | Gilon et al. |
| 2009/0229264 A1 | 9/2009 | Gilon et al. |
| 2009/0250052 A1 | 10/2009 | Gilon et al. |
| 2010/0006087 A1 | 1/2010 | Gilon et al. |
| 2010/0139644 A1 | 6/2010 | Schwarzbach et al. |
| 2010/0191378 A1 | 7/2010 | Gilon et al. |
| 2010/0236239 A1 | 9/2010 | Kroizer et al. |
| 2010/0263709 A1 | 10/2010 | Norman et al. |
| 2010/0282242 A1 | 11/2010 | Gilon et al. |
| 2010/0300510 A1 | 12/2010 | Goldman et al. |
| 2011/0088396 A1 | 4/2011 | Katz et al. |
| 2011/0220091 A1 | 9/2011 | Kroyzer |
| 2012/0024282 A1 | 2/2012 | Gilon et al. |

FOREIGN PATENT DOCUMENTS

| | | |
|---|---|---|
| JP | 56-102646 | 8/1981 |
| WO | WO 2004/004016 | 1/2004 |
| WO | WO 2004/067933 | 8/2004 |
| WO | WO 2007/118223 | 10/2007 |
| WO | WO 2008/092194 | 8/2008 |
| WO | WO 2008/092195 | 8/2008 |
| WO | WO 2008/114248 | 9/2008 |
| WO | WO 2008/118980 | 10/2008 |
| WO | WO 2008/128237 | 10/2008 |
| WO | WO 2008/154599 | 12/2008 |
| WO | WO 2009/015219 | 1/2009 |
| WO | WO 2009/015388 | 1/2009 |
| WO | WO 2009/021099 | 2/2009 |
| WO | WO 2009/055624 | 4/2009 |
| WO | WO 2009/070774 | 6/2009 |
| WO | WO 2009/103077 | 8/2009 |
| WO | WO 2009/131787 | 10/2009 |
| WO | WO 2011/064718 | 6/2011 |
| WO | WO 2011/140021 | 11/2011 |
| WO | WO 2012/014153 | 2/2012 |

OTHER PUBLICATIONS

"Central Receiver Systems" in: Stine, W.B., and Geyer, M., Power from the Sun [online], 2001 [retrieved on Nov. 17, 2009]. Retrieved from the Internet: <URL: http://www.powerfromthesun.net/Chapter10/Chapter10new.htm>, Chapter 10.

Cohen et al., "Final Report on the Operation and Maintenance Improvement Project for Concentrating Solar Power Plants," SAND99-1290 [online], Jun. 1999 [retrieved on May 16, 2012]. Retrieved from the Internet: <URL: http://infohouse.p2ric.org/ref/17/16933/1693301.pdf>.

Lopez-Martinez et al., "Vision-based system for the safe operation of a solar power tower plant," Iberamia, 2002, LNAI 2527: pp. 943-952.

"Mean and Peak Wind Load Reduction on Heliostats," Colorado State University, Solar Energy Research Institute, U.S. Department of Energy [online], Sep. 1987 [retrieved on May 16, 2012]. Retrieved from the Internet: <URL: http://www.nrel.gov/docs/legosti/old/3212.pdf>.

Meduri et al., "Performance Characterization and Operation of Esolar's Sierra Suntower Power Tower Plant," SolarPACES 2010 Conference, Sep. 21-24, 2010, Perpignan, France.

Mills et al., "Multi-Tower Solar Array Project," *Proceedings of the Solar Harvest Conference, 40th Annual ANZSES Conference*, 2002.

Peterka et al., "Wind Load Reduction for Heliostats," Solar Energy Research Institute, U.S. Department of Energy [online], May 1986 [retrieved on May 16, 2012]. Retrieved from the Internet: <URL: http://www.nrel.gov/docs/legosti/old/2859.pdf>.

Phipps, Gary S., "Heliostat Beam Characterization System Calibration Technique," U.S. Department of Commerce, National Technical Information Service, Sandia Labs, SAND791532C, 1979.

Pottler et al., "Photogrammetry: A Powerful Tool for Geometric Analysis of Solar Concentrators and Their Components," Journal of Solar Energy Engineering, Feb. 2005, 127(1): pp. 94-101.

Rabl, A., "Tower Reflector for Solar Power Plan," *Solar Energy*, 1976, 18: pp. 269-271.

(56) References Cited

OTHER PUBLICATIONS

Roschke, E.J., "Wind Loading on Solar Concentrators: Some General Considerations," Jet Propulsion Laboratory, National Aeronautics and Space Administration, U.S. Department of Energy [online], May 1984 [retrieved May 16, 2012]. Retrieved from the Internet: <URL: http://ntrs.nasa.gov/archive/nasa/casi.ntrs.nasa.gov/19840024844_1984024844.pdf>.

Shortis et al., "Photogrammetric Analysis of Solar Concentrators," Proceedings of the 12th Australian Remote Sensing and Photogrammetry Conference, Fremantle, Australia, 2004, pp. 1-10.

Slack et al., "Esolar Power Tower Performance Modeling and Experimental Validation," SolarPACES 2010 Conference, Sep. 21-24, 2010, Perpignan, France.

Stone, K.W., and Jones, S.A., "Analysis of Solar Two Heliostat Tracking Error Sources," Sandia National Laboratories, Report No. SAND99-0239C, Jan. 28, 1999.

Strachan, J.W. and Houser, R.M., "Testing and Evaluation of Large-Area Heliostats for Solar Thermal Applications," Solar Thermal Test Department, Sandia National Laboratories, SAND92-1381, Feb. 1993.

Vant-Hull, L.L., and Pitman, C.L., "Static and Dynamic Response of a Heliostat Field to Flux Density Limitations on a Central Receiver," Solar Engineering, 1990, pp. 31-38.

Extended European Search Report and Search Opinion issued Jul. 5, 2011, in European Patent Application No. 09710772.

Patent Examination Report issued Apr. 16, 2013, in Australian Patent Application No. 2009213563.

Camacho et al., "Control of Central Receiver Systems," Chapter 6 in Control of Solar Energy Systems, 2012, pp. 239-313.

* cited by examiner

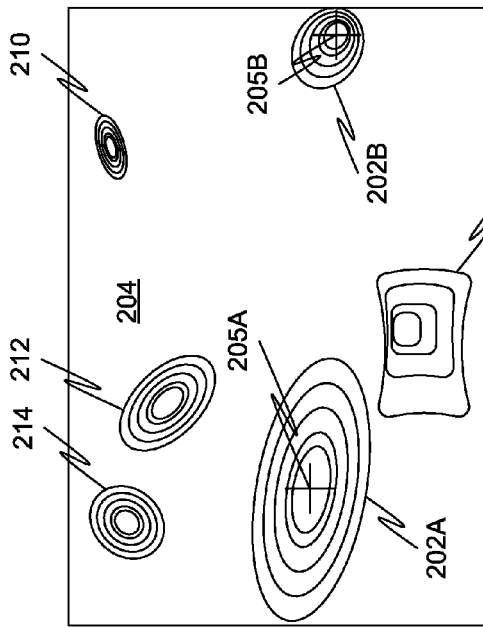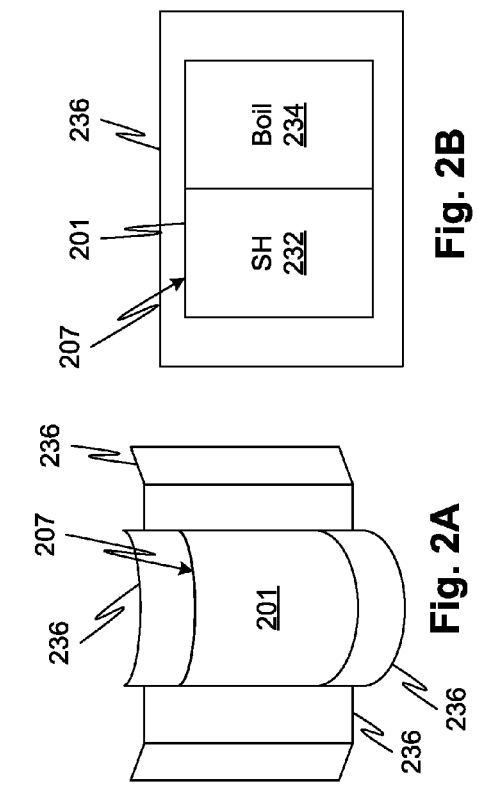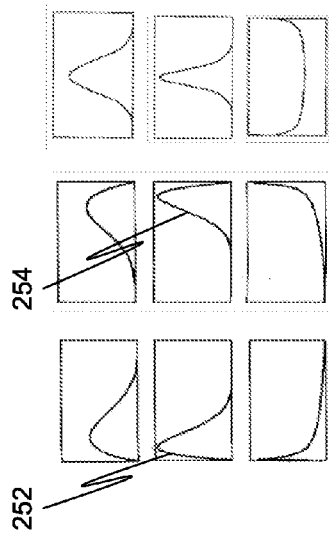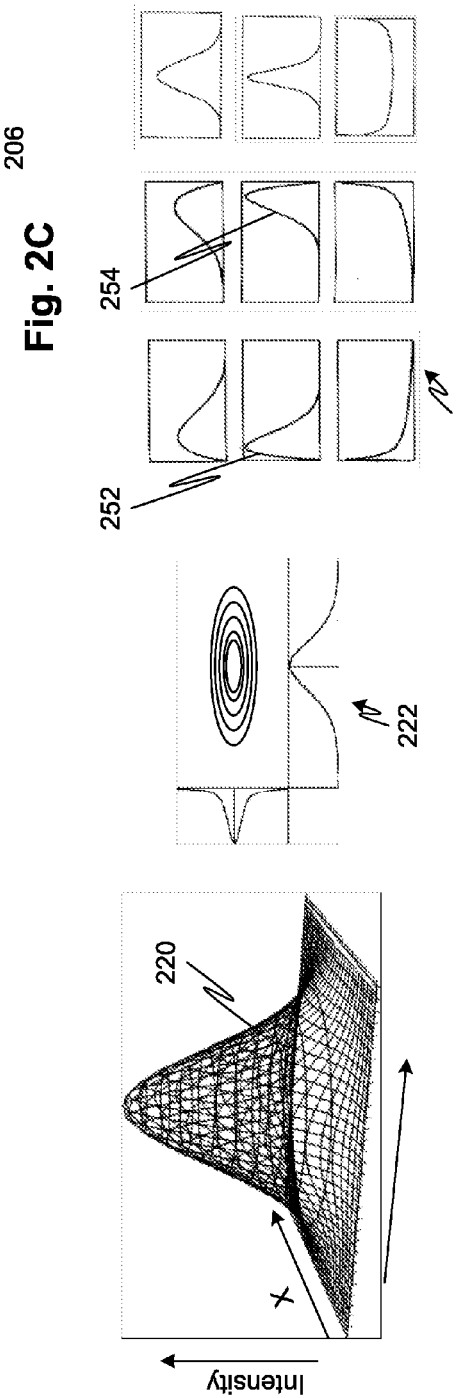
Fig. 2A  Fig. 2B  Fig. 2C  Fig. 2D  Fig. 2E  Fig. 2F

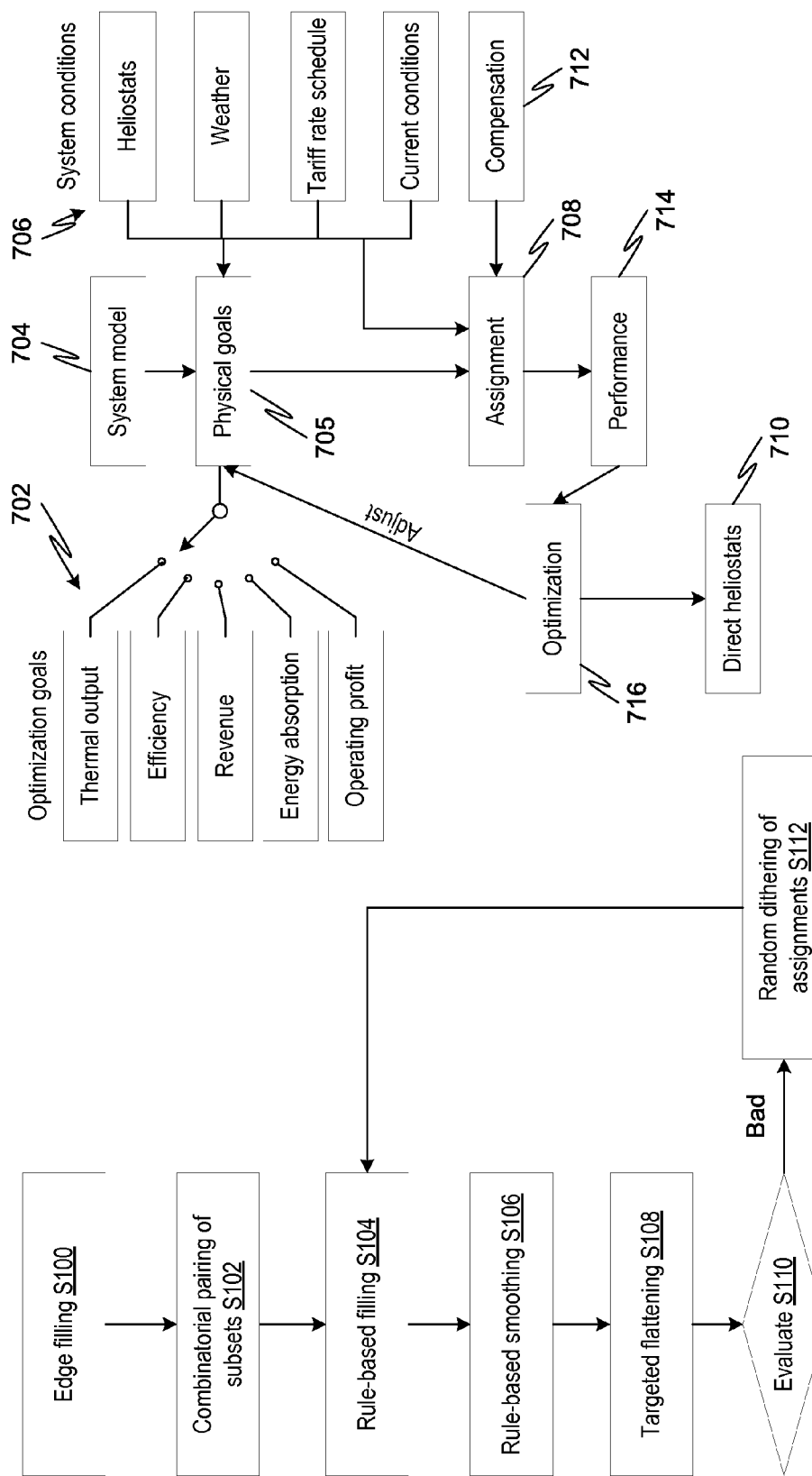

DEVICES, METHODS, AND SYSTEMS FOR CONTROL OF HELIOSTATS

CROSS-REFERENCE TO RELATED APPLICATIONS

This application is a national stage application of International Application No. PCT/US09/34323, filed Feb. 17, 2009, which claims the benefit of U.S. Provisional Application No. 61/028,525, filed on Feb. 14, 2008, both of which are incorporated herein by reference in their entireties.

FIELD

The present disclosure relates generally to the conversion of solar radiation to other useful forms of energy, including thermal and chemical energy and electricity, and, more particularly, to the control of heliostats in solar power system.

SUMMARY

In a solar power system, adherence to flux or resultant measurable parameter limits, ranges, or patterns can be achieved by directing heliostat mounted mirrors to focus on aiming points designated on the surface of a solar receiver. Different heliostats can be directed to different aiming points, and a heliostat can be directed to different aiming points at different times. The cumulative flux distribution resulting from directing a plurality of heliostats to any aiming point on a receiver surface can be predicted by using statistical methods to calculate the expected beam projection for each individual heliostat or alternatively for a group of heliostats. Control of the heliostats in a solar power system can include designating aiming points on a receiver from time to time and assigning heliostats to aiming points from time to time in accordance with an optimization goal.

According to one or more embodiments of the disclosed subject matter, a method for controlling heliostats can include (i.e., comprise) accessing projection data representing reflection characteristics of each of a plurality of heliostats, each heliostat being aimable at a receiver. The method can further include, for each of the plurality of heliostats, predicting a flux intensity projection pattern for each of multiple aiming points on the receiver responsively to the projection data respective to the each of the plurality of heliostats. The method can further include, for each of a subset of the plurality of heliostats, selecting one of the multiple aiming points corresponding to the each of the subset responsively to previously selected aiming points corresponding to others of the plurality of heliostats. The selecting can include applying at least one rule having the effect that when the selecting is repeated for all of the subset, a cumulative distribution of flux over the receiver surface is substantially uniform or substantially matches a predetermined pattern of flux. The method can further include generating a control command responsively to the selecting to cause at least some of the plurality of heliostats to target the selected ones of the multiple aiming points.

The at least one rule can include assigning a value to each of the multiple aiming points. The value can correspond to the degree to which a marginal contribution to a predicted cumulative distribution resulting from the selected aiming points corresponding to others of the plurality of heliostats reduces the smoothness of the predicted cumulative distribution. Alternatively, the value can correspond to the degree to which a marginal contribution to a predicted cumulative distribution resulting from the selected aiming points corresponding to others of the plurality of heliostats increases a difference between the minimum and maximum of the predicted cumulative distribution. In yet another alternative, the value can correspond to the degree to which a marginal contribution to a predicted cumulative distribution resulting from the selected aiming points corresponding to others of the plurality of heliostats produces a variation of the predicted cumulative distribution having a predefined shape.

The method of controlling heliostats can further include defining an ordering of the plurality of heliostats responsively to the projection data. The projection data can include parameters of a two-dimensional Gaussian.

The selecting can include selecting one of the multiple aiming points for each of the subset at least every hour for a period of at least four hours per day for multiple consecutive days. Alternatively, the selecting can include selecting one of the multiple aiming points for each of the subset at least every half hour for a period of at least four hours per day for multiple consecutive days.

The predicting a flux intensity can be responsive at least to a predicted attenuation caused by dirt accumulation upon, or atmospheric particulates or aerosols between the receiver and, the each of the plurality of heliostats and/or a measured insolation rate received by the each of the plurality of heliostats.

According to one or more embodiments of the disclosed subject matter, a method for controlling heliostats can include accessing projection data representing reflection characteristics of each of a plurality of heliostats, each heliostat being aimable at a receiver, and, for each of the plurality of heliostats, predicting a flux intensity projection pattern for each of multiple aiming points on the receiver responsively to the projection data respective to the each of the plurality of heliostats. The method can further include, at least multiple times per day, calculating the cumulative effect of aiming the each of the plurality of heliostats at alternative ones of the multiple aiming points and selecting a respective one of the alternative ones for each of the plurality such that aiming the plurality of heliostats according to the selected aiming points provides a substantially uniform distribution of flux on the receiver. The method can still further include generating a control command responsively to the selecting to cause at least some of the plurality of heliostats to target the selected ones of the multiple aiming points. The calculating can include determining a marginal effect of the each of the plurality of heliostat aiming points on a cumulative flux distribution generated by multiple heliostat-selected aiming points.

According to one or more embodiments of the disclosed subject matter, a method for controlling heliostats can include accessing projection data representing reflection characteristics of each of a plurality of heliostats, each heliostat being aimable at least one receiver, and, for each of the plurality of heliostats, predicting a flux intensity projection pattern for each of multiple aiming points on the at least one receiver responsively to the projection data respective to the each of the plurality of heliostats. The method can further include controlling a flux intensity distribution on the receiver in real time by changing aiming points of multiple heliostats responsively to the projection data and predefined data representing an upper bound on flux gradient and/or temperature gradient, where the gradients are with respect to a receiver surface.

The upper bound can vary according to a respective portion of the at least one receiver or a respective one of the at least one receiver. Alternatively, the upper bound can vary according to a portion of the at least one receiver or a respective one of the at least one receiver. The respective portion of the at least one receiver or the respective one of the at least one receiver can be operated at a higher temperature than at least one other portion of the at least one receiver or at least one other of the at least one receiver, where the at least one receiver includes multiple receivers.

According to one or more embodiments of the disclosed subject matter, a method for controlling heliostats can include accessing projection data representing reflection characteristics of each of a plurality of heliostats, each heliostat being aimable at one or more receivers, and, for each of the plurality of heliostats, predicting a flux contribution for each of multiple aiming points on the receiver respective to the each of the plurality of heliostats. The method can also include selecting aiming points for the each of the plurality of heliostats responsively to results of the predicting and adjusting control of the heliostats to reflect light at the aiming points responsively to the selecting. At each of several times each day, the predicting, selecting, and adjusting may be repeated. The predicting can include predicting a flux contribution responsively to measured insolation levels and measured and/or calculated atmospheric attenuation levels.

The selecting can include selecting responsively to a command containing a demand for heat energy by a power production plant. Alternatively, the selecting can include selecting responsively to a command containing a demand for heat energy by a power production plant and the command specifies one of the one or more receivers, or a portion of a receiver carrying a different heat transfer medium that other receivers or portions of a receiver.

According to one or more embodiments of the disclosed subject matter, a method for controlling heliostats can include accessing projection data representing reflection characteristics of each of a plurality of heliostats, each heliostat being aimable at one or more receivers, and, at a first time, for each of the plurality of heliostats, for each of multiple aiming points, computing a metric indicating a contribution of the each of the plurality of heliostats to a distribution of flux over at least a portion of the one or more receivers. The method can further include, for each of the plurality of heliostats, selecting a one of the aiming points responsively to the metric and responsively to a real time measured condition, and, at a second time, repeating the computing and selecting. The method can additionally include generating a control command responsively to the selecting to cause at least some of the plurality of heliostats to target the selected ones of the multiple aiming points.

The metric can be responsive to a uniformity of flux cumulatively taken across a surface of the at least a portion. Alternatively, the metric can be responsive to a predefined minimum flux cumulatively taken over an entirety of the at least a portion. In yet another alternative, the metric can be responsive to a uniformity of flux cumulatively taken across a surface of the at least a portion, the uniformity being quantified responsively to a material of which the at least a portion is made. In still another alternative, the metric can be responsive to a quantity of reflected light from the each of the plurality that is predicted to miss the one or more receivers.

The method can further include controlling the each of the plurality to change position responsively to an apparent movement of the sun across the sky and the selected aiming point. The first and second times can be separated by less than an hour. The first and second times can be separated by smaller time differences during high insolation periods than during low insolation periods. The method can further include, at subsequent times, repeating the computing and selecting more than ten times in a single day.

At least one of the aiming points can correspond to a standby position of the each of the plurality in which no light is reflected by the each of the plurality to the at least a portion. The aiming points of different ones of the plurality of heliostats can be different.

According to one or more embodiments of the disclosed subject matter, a control system for a concentrating solar collector system can include a controller programmed to access stored projection data representing reflection characteristics of each of a plurality of heliostats, each heliostat being aimable at a receiver. The controller can be programmed to, for each of the plurality of heliostats, calculate a predicted flux intensity projection pattern for each of multiple aiming points on the receiver responsively to the projection data respective to the each of the plurality of heliostats. The controller can also be programmed to, for each of a subset of the plurality of heliostats, select one of the multiple aiming points corresponding to the each of the subset responsively to previously selected aiming points corresponding to others of the plurality of heliostats, by applying at least one rule. The at least one rule can have the effect that when the selecting is repeated for all of the subset, a cumulative distribution of flux over the receiver surface is substantially uniform or substantially matches a predetermined pattern of flux. The controller can be configured to output a command to control the plurality of heliostats according to the aiming points selected by it.

The at least one rule include assigning a value to each of the multiple aiming points. The value can correspond to the degree to which a marginal contribution to a predicted cumulative distribution resulting from the selected aiming points corresponding to others of the plurality of heliostats reduces the smoothness of the predicted cumulative distribution. The value can correspond to the degree to which a marginal contribution to a predicted cumulative distribution resulting from the selected aiming points corresponding to others of the plurality of heliostats increases a difference between the minimum and maximum of the predicted cumulative distribution.

The selecting can include selecting one of the multiple aiming points for each of the subset at least every hour for a period of at least four hours per day for multiple consecutive days. Alternatively, the selecting can include selecting one of the multiple aiming points for each of the subset at least every half hour for a period of at least four hours per day for multiple consecutive days.

The predicting a flux intensity can be responsive at least to a predicted attenuation caused by dirt accumulation upon, or atmospheric particulates or aerosols between the receiver and the each of the plurality of heliostats and/or a measured insolation rate received by the each of the plurality of heliostats.

According to one or more embodiments of the disclosed subject matter, a method for controlling heliostats can include calculating an indication of an effect of controlling a plurality of heliostats that are aimed at respective target points on a surface of a receiver. The effect can include at least one of a maximum temperature or flux per unit area, a temperature or flux gradient, and a temperature or flux uniformity at least partly across the surface. The method can further include controlling heliostats to aim reflected sunlight at selected ones of the respective target points responsively to the calculating so as to maintain the at least one in one or more predefined ranges respective to the at least one. The method can additionally include repeating the calculating and controlling at multiple times per day such that at least some of the heliostats are aimed at different ones of the respective target points and so as to maintain the at least one in one or more predefined ranges respective to the at least one continuously during a substantial part of a day.

According to one or more embodiments of the disclose subject matter, a method for controlling heliostats can include updating target aiming spots for a plurality of heliostats multiple times per day so as to maintain at least one of a maximum temperature or flux per unit area on a target, a temperature or flux gradient of the target, and a temperature or flux uniformity at least partly across a surface of the target. The aiming spots can be in different positions on the target. The method can further include controlling the plurality of heliostats to direct energy onto respective target aiming spots responsively to a result of the updating.

Objects, advantages and novel features will be apparent from the following detailed description when considered together with the accompanying drawings.

BRIEF DESCRIPTION OF THE DRAWINGS

FIGS. 2A and 2B illustrate features of one or more receivers of the system of FIG. 1 according to embodiments of the disclosed subject matter.

FIG. 2C is a planar development of the receiving surface of a receiver illustrating aspects of an assignment function of a control system according to embodiments of the disclosed subject matter.

FIGS. 2D, 2E, and 2F illustrate features of beam spot flux distributions according to embodiments of the disclosed subject matter.

FIG. 6 illustrates a process for assigning heliostats that employs both progressive and combinatorial optimization techniques.

FIG. 7 is a block diagram of an optimization procedure that includes heliostat assignment as a component.

DETAILED DESCRIPTION

Figure 1:
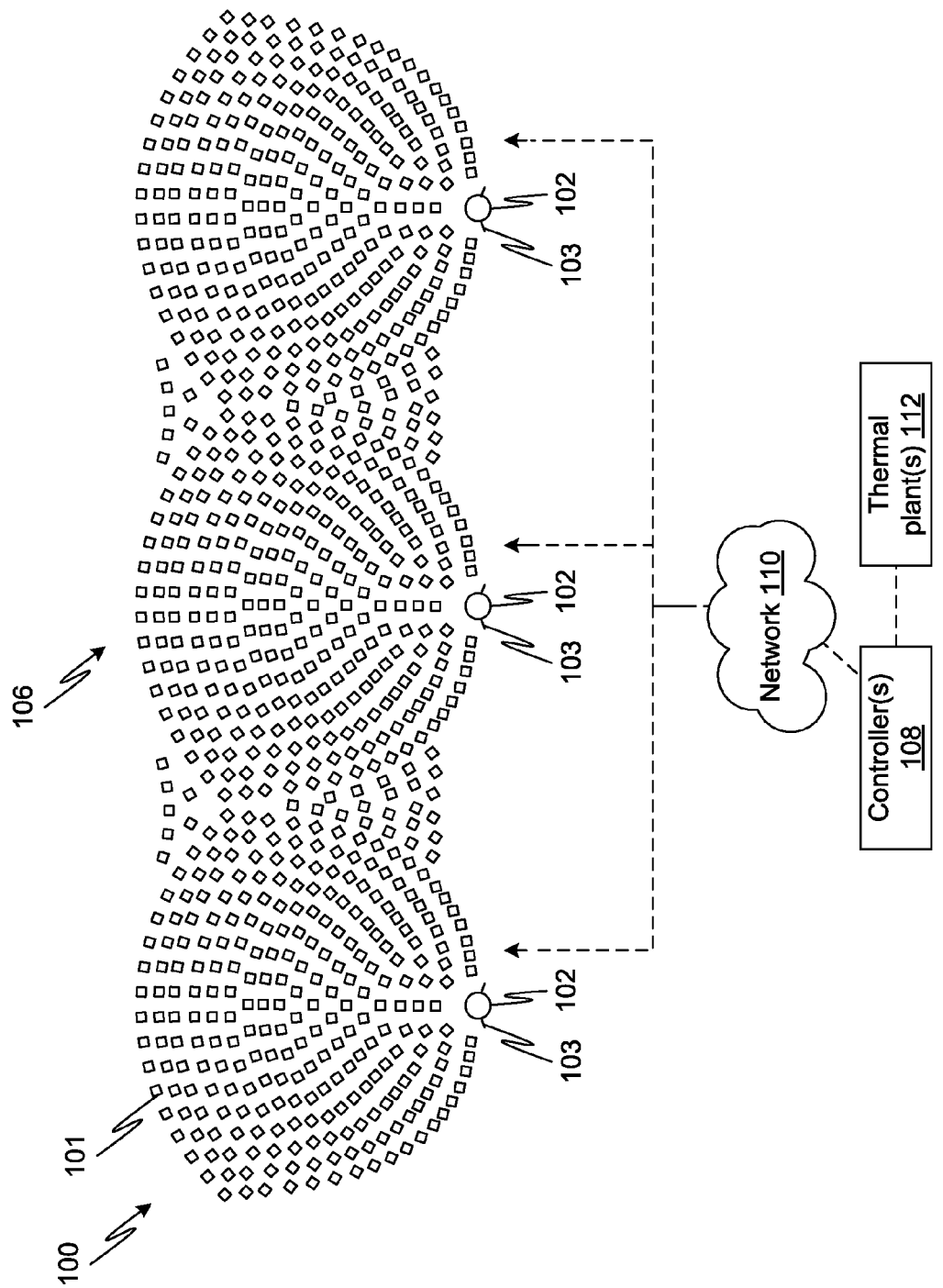
FIG. 1 illustrates various features of one or more types of solar power generating stations employing heliostat fields to focus energy on one or more receivers with control systems, communication systems, and thermal power conversion elements.

A solar tower system includes a target, called a receiver, upon which solar radiation is reflected from a plurality of heliostat-mounted mirrors. A solar tower system may also include multiple targets. A receiver is generally provided in a central location within a direct or indirect beam line relative to the various heliostat-mounted mirrors (hereafter heliostat-mounted mirrors are referred to simply as heliostats) such as atop a tower or other support and located in proximity of the heliostats in an arrangement that may be called a solar field.

A solar tower system is preferably designed to utilize solar radiation reflected by heliostats at a concentration of tens of suns or even hundreds of suns, where a 'sun' is roughly equivalent to a flux or power density of one kilowatt per square meter of surface area. In some systems, to efficiently utilize such concentrated solar radiation, it is desirable to ensure that the distribution of flux on the surface of the receiver falls within predetermined limits, ranges or patterns of flux. The uniform distribution is one of the control goals pursued by an "assignment task" in which heliostats are assigned to a target on a receiver and subsequently controlled to maintain focused insolation on that target by tracking the apparent movement of the sun. In embodiments this assignment task is performed by a method that includes prediction of the beam spots for a set of candidate targets for all heliostats and choosing a set of target assignments.

A solar field may include tens of thousands of heliostats. In some embodiments, the one or more receivers may include a vessel or conveyance, such as a tube bank, in which a substance is heated. In alternative embodiments, receivers include other elements for energy conversion, such as photovoltaic cells or photosynthetic organisms, which form part of the receiver or act as separate receivers. For example, in an embodiment, a thermal receiver has photovoltaic converters adjacent to the thermal receiving surfaces to catch flux spillage from heliostats that completely or partly miss the thermal receiving surfaces.

A solar tower system is preferably designed to utilize solar radiation reflected by heliostats at a concentration corresponding to the requirements of the system utilizing the energy and various design and materials specifications. Concentrating systems can focus the energy, for example, of several times, tens of times, or even hundreds of times the energy of the sun, or hundreds of "suns." The energy flux unit "sun" is roughly equivalent to a power density of one kilowatt per square meter of surface area.

Adherence to flux (or resultant measurable parameter) limits, ranges or patterns can be achieved by directing heliostats to virtual points designated on the surface of a receiver, which are called aiming points. Different heliostats can be directed to different aiming points, and a heliostat can be directed to different aiming points at different times. The cumulative flux distribution resulting from directing a plurality of heliostats to any aiming point on a receiver surface can be predicted by using statistical methods to calculate the expected beam projection for each individual heliostat or alternatively for a group of heliostats. A suitable statistical method is one that assumes a substantially Gaussian distribution of light energy. The number of aiming points or potential aiming points designated at any one time on the surface of a receiver is not fixed and varies in accordance with the methods described in the various embodiments; the actual number can range from fewer than 10 to many thousands. In some embodiments, all designated aiming points are assigned to heliostats, and in alternative embodiments not all designated aiming points are assigned to heliostats. (Terms such as 'assignment of heliostats to aiming points' and 'assignment of aiming points to heliostats' are used interchangeably.)

It is desirable to designate aiming points on the surface of a receiver, and to assign heliostats to aiming points, in a manner that will contribute to achieving an optimization goal, such as optimizing system efficiency, maximizing system energy conversion or output, or maximizing revenues from the sale of electricity or other forms of energy. Additionally it is desirable to designate the aiming points and to assign the heliostats while taking into account physical and operating constraints, which can include, for example, materials temperature or strength limitations of components of the receiver, flux allocation to various sections of a receiver surface, and the amount of reflected radiation that is expected to miss the target (called spillage).

A control system is preferably provided to assist system operators in controlling the operation of a solar tower system, and in particular in controlling the operation of heliostats.

Controlling heliostats in a solar tower system includes at least one of the assignment of heliostats to aiming points; causing the heliostat to track the apparent movement of the sun across the sky each day, generally in order to continuously reflect solar radiation onto a receiver, but also on occasion to maintain a standby mode or a transit mode; causing the heliostat to pivot to and remain in a 'stow' or 'safe' position in case of high winds, at night, or at times when solar radiation that could be reflected by the heliostat onto the target is not needed; and causing a heliostat to change its focus from one receiver to another.

In an embodiment, a method for controlling heliostats in a power tower system includes designating aiming points on a receiver from time to time, and additionally includes assigning heliostats to aiming points from time to time. The designation of aiming points and/or their assignment to heliostats can be done at any desired time resolution. For example, the time resolution can be every half second. In other examples, the time resolution is every minute, every 15 minutes, or every two hours. The designation of aiming points and the assignment of heliostats to aiming points can each be done at different time resolutions; in an example, aiming points are designated every two minutes and heliostats are assigned to aiming points every 15 seconds.

The time resolution can be changed by the system operator or by a control system in accordance with the operational needs of the system or as a reflection of other circumstances. In an example, the designation of aiming points and/or the assignment of heliostats to aiming points is performed more frequently during periods of high insolation such as midday in the summer, when a receiver is more likely to operate at or near its thermal or power limits, than during periods of low insolation such as early mornings, late afternoons and winter days.

According to an embodiment, sets of potential aiming points are designated for each individual heliostat, meaning that different heliostats can have different sets of potential aiming points. The actual aiming point assigned to a heliostat at any time can be selected from the set of potential aiming points currently designated for that heliostat. A set of potential aiming points may include as few as one potential aiming point and as many as several hundred. In an alternative embodiment, sets of potential aiming points are designated for groups of heliostats, and the groups are selected on the basis of at least one common or similar characteristic among the heliostats included in the group. Examples of such grouping characteristics are distance from the receiver and cosine loss factors.

The present disclosure presents embodiments of control systems for solar concentrating systems that can provide benefits to thermal solar power plant applications, which generate electricity by heating a working fluid (for example, directly or through an intermediate heat transfer fluid). In many thermal power applications, to efficiently utilize concentrated solar radiation, it is desirable to ensure that the amount and distribution of flux on the surface of the receiver falls within predetermined requirements. In a perfect system, a "flat" energy distribution at the highest material tolerance would provide the highest possible temperatures to a working fluid thereby assuring the highest possible thermal efficiency of a thermoelectric power system. In a concentrating solar system this is a difficult ideal to approach for various reasons, among them:

1. The changes in the apparent position of the sun with time of day and season;
2. The variations in attenuation of the atmosphere due to dust, weather, and pollution;
3. Transient variations in the amount of directable radiation falling on each heliostat due to passing clouds;
4. Variations in reflectance of each heliostat due to dirt such as dust, bird droppings, corrosion, etc.;
5. The flux distribution across the beam that each heliostat creates at any given angle of reflection due to the unique shape of its mirror;
6. The variation in the flux distribution pattern which each heliostat creates for each target point on the receiver due to differences in the distance, orientation, and shape of the receiving surface with respect to the heliostat, including focus error and astigmatism;
7. The flux distribution across the beam that each heliostat creates due to blocking effect of direct or reflected light by adjacent heliostats or other structures (e.g., buildings, trees, hills, etc.).
8. The variation in the demands of respective portions of one or more receivers, such as superheating, reheating, boiling, and other receiver portions whose functions may be optimized by taking into account the demands of the energy conversion processes, such as a thermal plant 112 as shown in FIG. 1 and located downstream of the receiver.
9. Changes in the availability of heliostats, for example as a result of unpredictable events, such as malfunctions, or predictable events, such as scheduled maintenance.
10. Errors in the performance or control of subsystems such as misdirected heliostats.

In embodiments of the devices, systems, and methods described herein, the above variations are compensated by predicting their effects computationally and choosing aiming points on the receiver or receivers that are computationally predicted to approach a substantially uniform flux distribution (or other non-uniform flux distribution, as may be desired). Once these aiming points are chosen, each heliostat is caused to track the sun to reflect sunlight to its respective chosen aiming point. The predictions are made using predicted and/or measured information corresponding to the factors listed above.

Referring to FIG. 1, a concentrating solar power system 100 has one or more fields 106 of heliostats 101 which reflect sunlight onto one or more central receivers 102, which may have primary portions and secondary portions 103 to catch spillage from the primary portions. A solar field may include tens of thousands of heliostats 101. In some embodiments, a receiver includes a vessel or conveyance in which a substance is heated, and in alternative embodiments includes elements for energy conversion, such as photovoltaic cells or photosynthetic organisms.

Referring also to FIGS. 2A and 2B, each one or more receivers 201 may have a primary thermal portion 207, which may in turn have respective portions that have different flux requirements such as superheating 232 and boiling 234 portions. The receivers 201 may be of any shape including curved, flat, cylindrical, and prismatic. Secondary portions 236 may capture energy spillage resulting from heliostats that are aimed near the periphery of the primary portion 207. The secondary portions 236 may include receivers or reflectors or other energy transfer devices including originating ends of fiber optic channels directing energy toward other receiver components. The secondary portions 236 may include photovoltaic converters. Although the depicted receivers 201 have thermal primary portions, the primary portion of the receiver may be another type of receiver, such as photovoltaic, and there may or may not be one or more secondary portions.

With respect to changes in the apparent position of the sun, algorithms exist, or can be readily obtained. Referring now also to FIG. 2C, in the embodiments disclosed, a heliostat is assigned a target point on the receiver primary portion 204, the primary portion 204 being illustrated as a planar development of the surface of the receiver which may be curved or have multiple surfaces forming angles with respect to each other. When a heliostat is assigned a target point it is controlled to continuously place reflected energy on the target point by compensating for changes in the apparent position of the sun with season and time of day. In the present application, when a heliostat is assigned to a target point, this tracking is performed automatically, for example by generating appropriate signals to a final controller, such as a multi-axis drive control. A central or distributed controller 108 may perform this function implicitly and convey suitable commands or signals through appropriate data channels illustrated figuratively by the example of a network 110. The controller 108 may also perform the heliostat-target assignment function as well, as discussed further below. Although the controller 108 is shown as a single central controller, there may be multiple controllers, for example one controller per heliostat or group of heliostats, or a central controller. Also, multiple controllers may be networked and may function as a grid computer where, for example, message passing is used to perform parallel computational tasks.

In an embodiment, heliostats are assigned to target positions of the one or more receivers based on real-time calculations. The real-time computing is preferably performed in a computer that communicates from time to time with the controllers of individual heliostats, either directly or indirectly through another computer in a hierarchical control system, or alternatively through a data network, and where the communication between the computer and the heliostat controllers includes instructions such as the assignment of heliostats to aiming points.

Referring to FIG. 2C, the "assignment" task performed by a controller is to assign each heliostat to a target position of the receiver 204. For this purpose, the controller may have access to, or stored therewithin, mirror data allowing the calculation of a flux distribution for a target surface, defined in three-space, for a given apparent position of the sun. This information may, for example, characterize the shapes of the one or more mirrors that are aimed at a time by the heliostat. This mirror data may be derived from measurements of the mirror surfaces or from predictions based on design information including the mirror and support. The prediction may account for, by modeling, distortion of the mirror surface by temperature, wind loading, and any other significant factors.

As illustrated in FIG. 2C, the beam energy distribution caused by the relative alignment of the mirror and target surfaces and the distances between them will affect the shape of the beam "spot" on the target. For example, the flux distribution 202A may be roughly characterized as a two-dimensional Gaussian as illustrated at 220 in FIG. 2D and at 222 in FIG. 2E. The mirrors may be designed such that their focus is roughly aligned with their potential target points, for example point 205A, but this is not essential. The position of the target point 205A may affect the shape and orientation of the beam spot, for example a spot 202A may be formed for a first target point 205A while a different shape and orientation of a beam spot 202B may be formed by the same heliostat for a different target point 205B. Also, since the target and heliostat positions as well as the angle may vary and due to limitations in accuracy of mirror shapes, some distortion of the beam spot on at least some targets will result from, for example, astigmatism. Also, the beam focus of some or all of the heliostats may not align with any point on the receiver(s) or there may not be a conventional focal plane (i.e., perpendicular to the beam angle) or any single focal plane for the given mirror shape. What is required of the predictive method is that the beam spot shape be predictable from the mirror data. The mirror data may provide for a detailed prediction of the beam spot or it may be more approximate. For example, the mirror may be characterized as a best fit to a paraboloid or spherical section and lookup data may be predefined to convert the mirror data to a characterization of the beam flux distribution, given the angle of incidence. Referring to FIG. 2D, the flux distribution may be represented, for example, as a two-dimensional Gaussian 220 which can be compactly characterized in terms of standard deviations and mean amplitude.

In an embodiment, a method for assigning heliostats to targets includes characterizing the expected beam projection of individual heliostats using an orthogonal linear transformation such as principal components analysis. The method includes calculating at least two preferably orthogonal eigenvectors from a set of data points assumed to have a Gaussian distribution, where the set of data points represents the expected beam projection of a heliostat. The method most preferably additionally includes calculating the angle of rotation between the eigenvectors and virtual x- and y-axes of a Cartesian coordinate overlay on a receiver surface or a portion thereof. The method may additionally include calculating a standard deviation $\sigma$ in at least the x-dimension, i.e., $\sigma_x$. The method additionally optionally includes calculating at least one of: a standard deviation in the y-dimension, $\sigma_y$; a standard deviation along either or both of the axes of the eigenvectors ($\sigma_x'$ and $\sigma_y'$); and a covariance of any two sets of values chosen from among x, y, x', and y'.

It is expected that a number of paradigmatic mirror shapes and beam flux distribution shapes may be defined to form a library each with their respective parameter lists. Referring to FIG. 2F, such a library may take into account variations 250 such as the energy distribution's skewness, kurtosis and other factors. The beam spots may vary in size, shape, orientation, and position determined by the target, as indicated, for example, at 206, 210, 212, and 214 in FIG. 2C.

The alignment between the target point and the beam may be determined according to any suitable beam-direction characterization, for example, the line of peak intensity may be the point which is positioned over the target point. In the embodiments described herein, the heliostats are controlled to aim each heliostat to direct its reflected energy at a respective target point. Further at least some of the target points (those of some of the heliostats) are updated repeatedly during the day in pursuit of an optimization goal. The result is an optimization of the flux distribution on the receiver(s) by compensating all of the varying factors enumerated above. This assignment task may be done optimally and responsively to demands of one or more power generating plants that are consuming the thermal energy provided by the receiver(s).

The temperature uniformity and upper temperature limits of the receiver surface portions may be provided to the controller(s) 108 as predetermined data based on materials and design specifications. The temperature uniformity information may be specified in the form of a gradient parameter for each respective surface portion. The gradient may be specified for predetermined directions or axes, for example where the receiver is a tube bank, temperature differences between adjacent tubes may not be as critical as temperature gradients along a given tube. Also, the gradient limits may vary depending on the function of the receiver portion, for example, portions carrying gas, having lower heat transfer coefficients, may be more sensitive to flux variation than multiphase fluid-carrying portions where phase change is occurring. So, for example, a superheating receiver portion may have one gradient and upper limit while a boiling portion of the receiver may have another.

In alternative embodiments, methods can include prediction, calculation and/or measurement of values of a resultant parameter, such as temperature on a receiver surface or within a receiver, electrical current generated by photovoltaic conversion, or growth of a photosynthetic organism. The limits, ranges, or patterns may apply uniformly or non-uniformly across the entire surface of a receiver or may apply to specific segments of a receiver surface. In some embodiments, the limits, ranges, or patterns are specified by the system's designer or operator in order to operate the system effectively and safely, and in other embodiments to optimize some aspect of system performance.

The temperature gradient and upper limit information may be converted into flux uniformity and limit goals that are used for real time control, particularly, the assignment task. This conversion may be based on steady state formulas most of the time, since changes from one time to another on days where weather may not cause abrupt changes will tend to be relatively small. At other times, such as start-up, fault conditions (including receiver, power system, and heliostat faults), and variations caused by weather such as clouds that block sun from certain heliostats, unsteady state modeling of the heliostat-receiver system may be required. These and other constraints may follow from thermal energy receivers as well as other types of receivers such as ones for photovoltaic conversion. Also, the predefined limits may vary over time, for example to compensate for aging of receiver materials. Also conversion modeling (e.g., temperature limit to flux limit conversion) may account for changes in the reflectivity of the receiver surface.

In embodiments, the assignment of heliostats to targets is done in order to meet or contribute to at least one optimization goal, where optimization goals include, but not exhaustively, maximum energy absorption, conversion, efficiency or output, maximum revenue generation, and maximum operating profit. In addition, the assignment is done in order to operate within at least one constraint, where constraints include, but not exhaustively, desired maximum energy flux, which can include a maximum flux per receiver, per receiver segment, or tube panel; temperature limitations; materials strengths; and minimization of spillage.

According to a further embodiment, the designation and/or assignment takes into account at least one type of substantially current or real-time data. The current data preferably includes at least one type of current weather data, where types of current weather data include insolation, ambient temperature, wind speed, relative humidity, and visibility. The current data optionally includes non-weather data such as: data as to which heliostats are currently in or out of service; currently measured conditions in or at a receiver such as fluid flow per flow loop, or temperature at a temperature-measuring point within the receiver and/or on its surface; or flux measurements from a flux measurement system Flux measurement may be performed photometrically by measuring light reflected from an array of reflectors positioned over the receiver, for example.

In yet another embodiment, the designation and/or the assignment uses historical data in at least one calculation. The historical data includes at least one of: historical weather, system performance, and receiver performance data. The historical data preferably includes data for the same day or season in previous years.

According to another embodiment, a method for assigning aiming points to heliostats in a solar power tower system includes characterizing the expected beam projection of individual heliostats. The expected beam projection of an individual heliostat is a three-dimensional projection on a portion of the surface of a receiver target, and in some cases outside the physical bounds of the receiver when the aiming point is sufficiently close to the edge of the receiver. Each data point in the projection includes information on the intensity of reflected light expected to reach that point on (or off) the receiver surface based on a calculation that includes some or all of the following factors: sun position; heliostat position and orientation; the effects of cosine losses; effects of occultation of incident and/or reflected radiation by neighboring heliostats or other structures; losses due to atmospheric attenuation; heliostat reflectivity; energy absorptivity of the receiver surface; distance from the heliostat to the tower; tower height; receiver shape; angle of beam projection on the surface of the receiver; and beam shape (calculated from sun shape and heliostat shape). The expected beam projection characterization optionally includes a probabilistic distribution of light intensity around an aiming point based on theoretical or measured aiming error. In an alternative embodiment, the method includes characterizing the cumulative expected beam projections of a group of heliostats.

In another embodiment, the characterization of the expected beam projection of a heliostat is used to designate potential aiming points on a receiver surface for the heliostat. In an alternative embodiment, the characterization of the expected beam projection of each heliostat in a field of heliostats, or in a subset of a field of heliostats, is used to designate potential aiming points on a receiver surface for each heliostat, and further to assign a heliostat to an aiming point. The designation of potential aiming points and/or the assignment of heliostats to aiming points includes creating a potential aiming point matrix for each heliostat (or, alternatively, each group of heliostats) by transforming a two-dimensional or three-dimensional representation of a receiver surface into a set of discrete points, using a mathematical technique such as discretization or quantization, and using a heuristic that takes into account heliostat characteristics included in the characterization of the expected beam projection of a heliostat (or the cumulative expected beam projections of a group of heliostats) and/or the physical dimensions or position of a receiver or a component thereof.

In an example, a heuristic employed in the creation of a potential aiming point matrix for a heliostat states that potential aiming points are to be evenly spaced at least ½ σ apart on each of the x and y axes, i.e., ½ $\sigma_x$ in the x dimension and ½ $\sigma_y$ in the y dimension. In another example, the heuristic states that potential aiming points are evenly spaced apart by a distance equal or proportional to the height and width of the heliostat's beam projection, each of which being calculated according to a predetermined flux cutoff; in other words, determining the height and width of the beam projection for the purposes of the heuristic ignores outer data points wherein light intensity is below a predetermined cutoff. In yet another example, the heuristic states that at least two potential aiming points are designated on each boiler tube panel. In a further example, the heuristic states that a potential aiming point is designated on the center point of each boiler tube panel. Any employed heuristic may incorporate multiple rules.

In another embodiment, the assignment of heliostats to aiming points further includes giving a relative score to each potential aiming point in a matrix of potential aiming points for each heliostat, and assigning the heliostat to the potential aiming point with the highest score. The score is based on at least one factor selected to reflect the contribution of the heliostat and its beam projection to meeting optimization goals while remaining within the constraints. As stated earlier, examples of optimization goals include optimizing system efficiency, maximizing system energy conversion or output, or maximizing revenues from the sale of electricity or other forms of energy. Examples of constraints include materials temperature or strength limitations of components of the receiver, flux allocation to various sections of a receiver surface, and the amount of reflected radiation that is expected to miss the target (called spillage), which is preferably minimized. Factors which can be included in the calculation of the relative score include, but not exhaustively: whether spillage is increased if the heliostat is assigned to a particular aiming point; the difference between a local flux limitation and total local assigned thus far, including the contribution of the present heliostat; total power impinging on the receiver including that of the present heliostat; symmetry of the flux map after addition of the present heliostat; and uniformity of the resulting flux map.

In an alternative embodiment, the method for assigning aiming points to heliostats in a solar power tower system includes characterizing the beam projection of only a subset of the heliostats; and additionally assigning an expected beam projection to a heliostat not in the subset based on the expected beam projection of at least one nearby heliostat in the subset, where the beam projection of a heliostat not in the subset is either interpolated from that of at least one neighboring heliostat in the subset or is assigned the same projection of a neighboring heliostat in the subset.

In another embodiment, a method for assigning aiming points to heliostats in a power tower system includes applying a combinatorial optimization technique. In an embodiment, the method also includes sorting a list of heliostats on the basis of a ranking function which uses heliostat-specific factors. The sorted list is used in the application of the combinatorial optimization technique. Heliostat-specific factors include at least one of: distance from tower, focal length, position in the field, range of possible rotation, time since last cleaning, time since last calibration, initial calibration parameters, age, heliostat density in the surrounding 'neighborhood' (and resulting occultation), availability history including time since last problem and/or number of problems in the preceding 12 months, and size and standard deviations of the expected beam projection. In an alternative embodiment, a pre-sorted list of heliostats is stored in a data storage medium for use in the combinatorial optimization technique.

In another embodiment, the combinatorial optimization technique can include applying a computational algorithm, a meta-algorithm or a meta-heuristic. In a first example of a combinatorial optimization technique, the technique can include applying a greedy algorithm to a ranked and sorted list of heliostats. A greedy algorithm is known in the art of combinatorial optimization techniques as an algorithm that follows the problem solving meta-heuristic of making the locally optimal choice at each stage with the hope of finding the global optimum. In the example, the application of a greedy algorithm includes considering the cumulative expected flux map of heliostats already assigned to aiming points but not the flux map contributions of heliostats not yet assigned to aiming points.

In a second example of a combinatorial optimization technique, the technique can include applying a semi-greedy heuristic, also known as a greedy-randomized adaptive search procedure, which is known in the art to consist of iterations made up from successive constructions of a greedy randomized solution and subsequent iterative improvements of it through a local search. In the example, the application of the semi-greedy heuristic includes replacing a previously assigned heliostat with another.

In a third example of a combinatorial optimization technique, the technique can include applying a random-restart hill-climbing algorithm, which is known in the art as a meta-algorithm built on top of the hill climbing algorithm (which involves local maximization of a function of an independent variable that has discrete states). Random-restart hill climbing runs an outer loop over hill-climbing, where each operation of the outer loop chooses a random initial condition, i.e., value of the independent variable, to start hill-climbing. The best value is kept, which means that if a new run of hill climbing produces a better result than the stored state, it replaces the stored state. In the example, the application of the random-restart hill-climbing algorithm uses multiple passes over a ranked list of heliostats and their respective potential aiming point matrices to find an at least locally optimal set of heliostat-to-aiming point assignments.

In a fourth example combinatorial optimization technique, the technique can include applying a Monte Carlo method, such as simulated annealing, known in the art as a generic probabilistic meta-algorithm for global optimization problems, and used in the art for locating a good approximation to the global optimum of a given function in a large search space. In the example, sets of heliostat-to-aiming point assignments are probabilistically tested for optimality against similar 'neighboring' sets on an iterative basis, and transitioned to such neighboring sets according to an acceptance probability function until a globally optimized solution is reached.

In an alternative embodiment, the technique includes dynamic programming techniques, such as cumulating local optima, which are reached by examining and assigning groups of heliostats (forward recursion, or bottom-up dynamic programming); reaching those local optima from a completely assigned set of heliostats using backwards recursion (or top-down dynamic programming); or a stochastic dynamic programming technique that uses, for example, a Monte Carlo simulation to create the stages (local optima) in either a forward or backward recursion technique.

In another alternative embodiment, the technique includes applying a brute-force or exhaustive search for a globally optimized solution. All possible heliostat to aiming point combinations are evaluated and the combination that yields expected results closest to the optimization goals, while remaining within the limit of the constraints, is selected.

Figure 5:
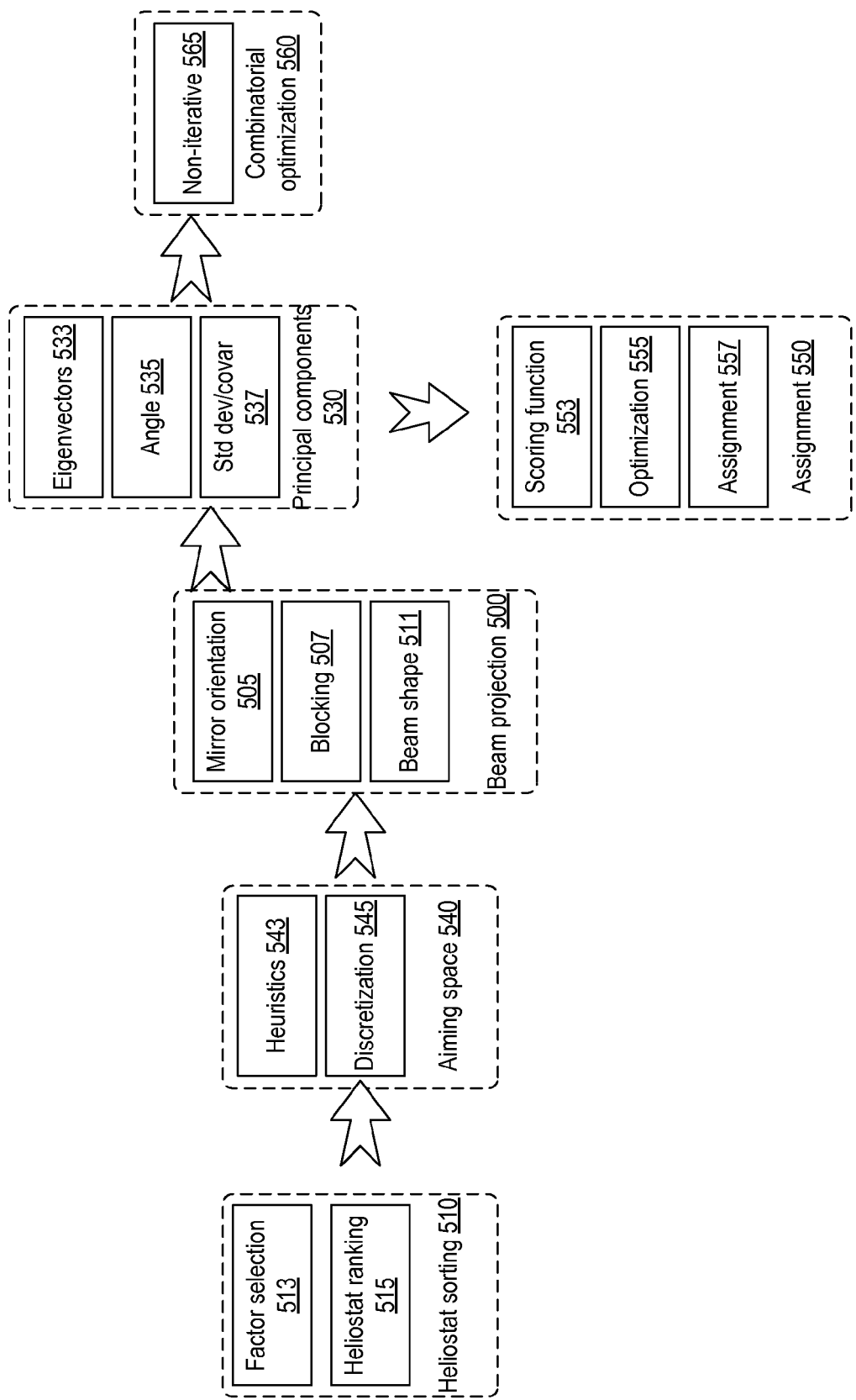
FIG. 5 is a block diagram showing the principal operations of a method for controlling heliostats in a power tower system according to embodiments of the disclosed subject matter.

Referring to FIG. 5, a method for controlling heliostats in a concentrating system begins with sorting 510 a list of heliostats, which are ranked according to factors selected in a first operation 513 to generate a ranked list in a second operation 515. The heliostats may be ranked according to a variety of criteria to further the function of assigning heliostats to targets. An assignment process may be progressive in that the heliostats are assigned and the cumulative effect of the flux superposition on the receiver surface determined as heliostats are assigned. Since the goal for some receiver portions may include a uniformity goal, it may be preferable to reserve certain heliostats whose projection pattern is particularly useful for precise filling in of flux "holes" or small aperture regions of lower flux distribution.

A criterion for selecting such heliostats may be sharpness of the calculated beam spot or some other criterion with which such sharpness is correlated, such as a position that corresponds to low astigmatism (low angle of incidence to reflect to target) and/or closeness of the heliostat to a receiver.

Another example of a criterion for ranking is the use of heliostats that can be used to direct their energy to multiple receivers, such as heliostats at the margins of fields in a multiple receiver system. Yet another criterion is to assign heliostats that are predetermined to have well-defined, precise, and repeatable beam spots such as close-in heliostats toward the end of the assignment so that they can be used to clean up a non-uniform cumulative flux distributions from less predictable ones which are assigned earlier. Still another criterion is that heliostats that are particularly useful for filling in the edges of the receivers with little spillage may be assigned early in the assignment process and therefore ranked higher in the list. Such heliostats may be, for example, heliostats that exhibit a sharp cutoff at certain sides of the beam spot, such as spots with a large amount of skewness.

A heliostat-specific assignment includes the following operations, which is repeated for each heliostat in the ranked list of heliostats. An expected beam projection calculation 500 is based on a current sun position, weather, and any other information which remains constant for all heliostats and all target positions. The aiming space 540 is then discretized 545 to provide a list of targets for each heliostat according rules or heuristics 543. The rules for discretization 545 may be, for example, according to factors such as how far the heliostat is from the receiver surface, the sharpness of the heliostats focus, and the orientation of tubes in the receiver surface.

In an example, a discrete set of targets on the surface of the one or more receivers form a regular rectangular array of points, where the number of points is larger for heliostats that are assigned later in the assignment process and the number of points is smaller for heliostats that are assigned earlier in the assignment process. In other examples, potential aiming points are evenly spaced apart by at least ½ standard deviation of a Gaussian fit to the heliostat's beam flux distribution in both the vertical and horizontal directions. Alternatively, they are evenly spaced apart by a distance equal or proportional to the height and width of the heliostat's beam projection calculated according to a predetermined flux cutoff. In another alternative (or in addition), the points are defined so that there is a minimum number designated on each boiler tube panel. In another alternative, a potential aiming point is designated on the center point of each boiler tube panel. In yet another alternative, the potential points are assigned by image processing the calculated cumulative flux distribution of previously assigned heliostats (see discussion of progressive assignment process) to identify points of low flux intensity, and a geometric center (center of mass or point of minimum intensity, for example) is defined at each of these flux "holes." In a refinement of this approach, the shape of a current heliostat's beam flux distribution is characterized, for example in terms of a standard width or widths and only holes that approximately match the shape are defined as potential targets. In a further refinement, a heliostat in the ranked list may be held in abeyance if no holes that are a good match are identified.

Where there is an edge-filling phase that occurs early in the assignment process, the discretization for those heliostats may not have any points remote from the receiver edges. The discretization may define points that are adjacent to a particular edge because of the shape and orientation of the heliostat which makes it particularly suitable for edge-filling. For example, heliostats with skewness patterns such as indicated at 252 (FIG. 2F) might have a set of target points aligned with a left edge while heliostats with skewness patterns such as indicated at 254 might have a set of target points aligned with a right edge.

For each heliostat and each target, the mirror orientation 505 required to aim at the target is calculated. For the same heliostat-target pair, blocking 507, and beam shape 511 are calculated. Once the beam projection 500 is calculated, a simplification of the calculated model of the beam may be done, unless it is derived directly from the beam projection calculation. In a principal components analysis 530 of the calculated beam, eigenvectors are calculated 533 from the beam section, an angle of rotation is determined 535, and standard deviation and covariance terms of a two-dimensional Gaussian are calculated 537. More sophisticated models of the distribution of energy in the beam may be used and the Gaussian is only presented as a simple example. It may be unnecessary to simplify the beam energy distribution prediction depending on the metrics for selecting the targets from the candidate target space and the sophistication of the controller performing the calculations.

Once the characteristics of the candidate targets for the heliostat are determined, the target assignment process 550 is performed. The latter includes calculating a scoring metric 553, in which a relative score is determined for each candidate target. The targets are ranked by score 555 and an assignment 557 stored for the heliostat by selecting the target with the most favorable score. The scoring may be a lumped parameter based on a set of rules which predict the marginal value of the assignment. So, for example, where a target reduces the overall smoothness of the energy distribution calculated for the heliostats assigned previously, a low score may be assigned. In addition, or alternatively, a spot that fills in energy near the edge of a receiver with very little spillage might be given a high score for a target near the edge. For heliostats assigned early, or in the middle of the ranked list, the assignment may be relatively random or with few random targets being assigned, leaving it for later assignment operations to fill in the non-uniformities in cumulative flux distribution up to that point.

Figure 4:
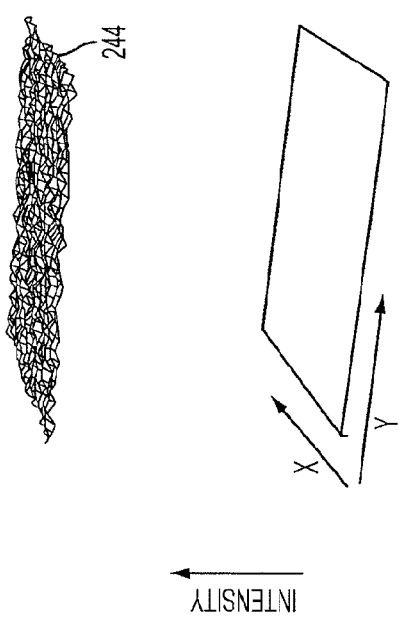
FIG. 4 illustrates phases of a progressive assignment function according to embodiments of the disclosed subject matter.

The scoring process may use different metrics at different stages of the heliostat list. For example, as shown in FIG. 4, the assignment of heliostats to fill the edges S10 may be done during the early assignments based on heliostats that were ranked for early assignment for that purpose. Then early heliostats may be assigned based on random targets S12. Intertwined with, or later, a regime that focuses on scores that are calculated to fill holes or reduce peaks S14 may be performed. In such cases, the cumulative flux distribution would be filtered to identify areas with flux peaks or valleys, and targets discretized with higher resolution over these areas and a scoring function used to give a high score to assignments that eliminated these undesired flux distribution features. Later heliostats may be assigned with a score that is weighted toward smoothing the cumulative flux distribution from earlier assignments S16, the rationale being that slow changes in flux with displacement are more likely to be filled in with later assignments than sharp changes. Toward the end of the heliostat ranked list, a precision smoothing operation S18 may be performed where higher resolution of the discretized target space is used. If the flux distribution exceeds the bounds for flux gradients or temperature limits, determined at S20, the heliostats may be reassigned starting at some point in the process by injecting small random values into the calculated scores or by randomly shuffling some of the assignments and performing stages S14, S16, and S18 again.

In an alternative assignment process 560, a direct "all-at-once" 565 approach is applied for assignment using combinatorial methods. For example, all possible assignments may be compared on the basis of a single cumulative metric such as predicted uniformity and average temperature across the surface of the receiver(s). A greedy algorithm may be used for such an approach or matrix or graph methods may also be used. In a particular example, combinatorial optimization approach, for example such as used for matching, flow, and shortest paths problems may be used. Because such methods currently known are believed to scale poorly, the assignment can be done in stages so that only a subset of heliostats is assigned at a time.

To illustrate a variation of progressive and combinatorial optimization, referring to FIG. 6, the assignment using combinatorial optimization may be done in stages as indicated at S102, where subsets of heliostats are assigned in multiple optimization passes. This may be done after an edge-filling process S100 as discussed elsewhere herein. Then, rule-based filling S104, as described above, may be done for a group of remaining heliostats, followed by a regime S106 employing rules that emphasize smoothing (i.e., the score rewards the marginal increase in smoothness of the cumulative flux distribution), followed by a regime S108 employing rules that emphasize uniformity of the predicted cumulative flux distribution (i.e., the score rewards the marginal increase in uniformity of the cumulative flux distribution). The process of FIG. 6 may evaluate S110 the completed predicted flux distribution and then randomly reassign S112 a predefined number of heliostats and repeat the processes 5104-S110 until a predetermined set of criteria are satisfied for uniformity and cumulative flux.

Figure 3A:
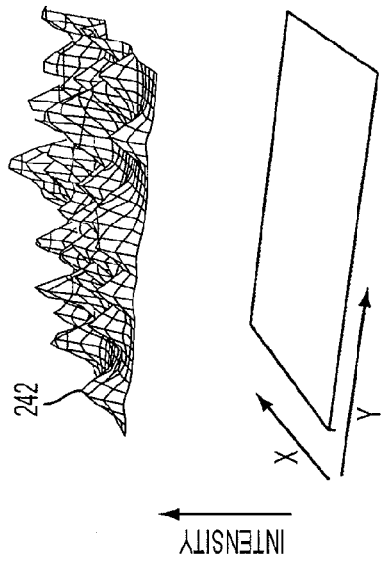
FIGS. 3A, 3B, and 3C illustrate predicted cumulative flux distribution at stages of a progressive assignment function of a control system according to embodiments of the disclosed subject matter.
Figure 3C:
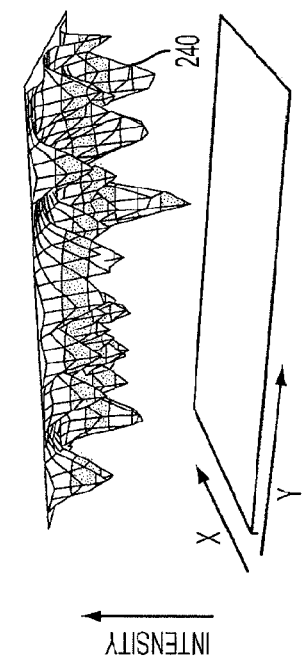
Figure 3B:
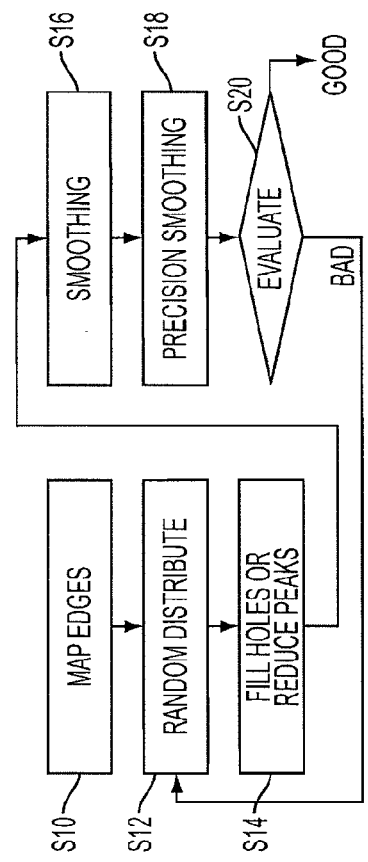

A progressive assignment process is illustrated figuratively in FIGS. 3A, 3B, and 3C. The flux distributions illustrated in these figures are calculated. Early in the assignment process, the flux distribution 240 has edges that are filled in and flux distribution is very rough and non-uniform. Later in the assignment process, the flux distribution 242 is somewhat smoother and the intensity at each point is higher, progressing toward the maximum limit. Toward the end of the assignment process the flux distribution 244 is closer to the maximum and relatively uniform.

Referring now to FIG. 7, the assignment task 708 may form part of an over-arching optimization procedure whose elements are illustrated in the block diagram. One or a combination of the various system optimization goals 702 identified may be used in combination with a system model 704 (simulation or simple parametric model) to define physical goals 705 for the assignment function 708, which may merely approximate or simply define a starting state to evaluate in terms of criteria defining the parameter to be optimized. For example, the physical goals may be average temperature and uniformity specifications for each receiver or receiver portion. The specification of the system goals takes into account system conditions 706, such as, but not limited to, the availability of heliostats, weather, tariff rate schedule, system thermodynamic state and any other conditions relevant to the particular optimization goal. The system may also take into account compensation 712, for example, for energy produced by the solar receiver in determining the assignment of the heliostats.

Once assignment is performed, the performance of the system under the particular assignment is assessed 714 and a performance metric supplied to an external optimization 716, such as a random-restart hill-climbing algorithm. The external optimization then adjusts parameters of the physical goals which then causes the assignment process to be repeated and so on until the outside optimization 716 reaches its end state. For example, the external optimization 716 may select a different combination of net flux on each receiver portion and perform the assignment operation based on that combination. For example, the receiver portions may be superheating, reheating, and boiling sections that feed a multistage turbine. Once the optimum state is determined, the heliostats are controlled 710 to direct energy according to the optimum assignment.

Note that in variations of the progressive and combinatorial assignment processes described, blocks of heliostats may be pre-assigned according to predefined rules. For example, predefined rules for optimum assignment may be worked out for a predefined set of sun angle conditions. Thus, blocks of heliostats may be assigned to provide a base cumulative flux distribution upon which the further heliostats are optimized. Thus, for example, the pre-assigned heliostats could take a progressive assignment to some intermediate state 242, such as discussed with reference to FIG. 3B. Such block assignments would reduce the scale of combinatorial optimization algorithms allowing them to run much faster. The rules for predefined block allocation may include random assignments in full or partial.

The operations, 540, 500, 530, and 550 may be repeated for each heliostat, going progressively through the ranked list, until all the heliostats are assigned. In a variation of the above, a set of heliostats are assigned en masse. In such a variation, the beam would be a combined beam including multiple heliostats which may form a composite beam. Such groups may be predetermined, for example, based on a flat flux distribution resulting from their combination for certain predefined beam angles.

In a further embodiment, a system for controlling heliostats in a power tower system can include: a receiver; a plurality of heliostats capable of tracking the sun to focus reflected light on a receiver; a computer processor; an operating system capable of real-time operation and a computer program for designating aiming points and/or assigning heliostats to aiming points at a desired time resolution.

In an embodiment, the computer program for designating aiming points and/or assigning heliostats to aiming points includes programming that considers optimization goals such as maximum energy absorption, conversion or output; maximum revenue generation; or maximum operating profit. In addition, the program includes programming that considers constraints such as a desired maximum energy flux, which can include a maximum flux per receiver segment or panel; temperature limitations; materials strengths; or minimization of spillage.

In another embodiment, the program takes into account current data, including at least one type of weather data. Examples of types of current weather data that may be taken into account include: insolation, ambient temperature, wind speed, relative humidity, or visibility. Examples of other current data taken into account include data as to which heliostats are currently in or out of service; currently measured conditions in or at a receiver such as fluid flow per flow loop, or temperature at a temperature-measuring point within the receiver and/or on its surface; or flux measurements from a flux measurement system.

In yet another embodiment, the program uses historical data in at least one calculation. The historical data includes at least one of historical weather, system performance or receiver performance data. The historical data preferably includes data for the same day or season in previous years. In an embodiment, the program performs the designation and/or assignment in accordance with any of the methods described herein.

It should be appreciated that the operations of the present disclosure may be repeated in whole or in part in order to perform a method for controlling heliostats in solar power system. Further, it should be appreciated that certain operations mentioned above may be performed on a single or distributed processor. Also, certain processes, modules, and units described in the various figures of the embodiments above may be distributed across multiple computers or systems or may be co-located in a single processor or system.

Aspects of the devices, systems, and methods for controlling heliostats in a solar power system may be implemented on a general-purpose computer, a special-purpose computer, an embedded or single board computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any process capable of implementing the functions or operations described herein can be used to implement embodiments of the methods, systems, and/or computer program products for controlling heliostats.

Furthermore, embodiments of the disclosed methods, systems, and computer program products for controlling heliostats may be readily implemented, fully or partially, in software using, for example, object or object-oriented software development environments that provide portable source code that can be used on a variety of computer platforms. Alternatively, embodiments of the disclosed methods, systems, and computer program products for controlling heliostats can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the methods, systems, and computer program products for controlling heliostats can be implemented in hardware and/or software using any known or later developed systems or structures, devices and/or software by those of ordinary skill from the functional description provided herein and with a general knowledge of the computer, solar power system, and/or automation arts.

Moreover, embodiments of the disclosed methods, systems, and computer program products for controlling heliostats can be implemented in software executed on a programmed general purpose computer, a special purpose computer, an embedded or single board computer, a microprocessor, or the like. Also, the control method of this disclosure can be implemented as a program embedded on a personal computer such as a JAVA® or CGI script, as a resource residing on a server or image processing workstation, as a routine embedded in a dedicated processing system, or the like. The methods, devices, and systems can also be implemented by physically incorporating certain aspects of the method for controlling heliostats into a software and/or hardware system, such as the hardware and software systems of a solar power system.

It is, therefore, apparent that there is provided, in accordance with the present disclosure, methods for controlling heliostats. While a number of embodiments have been described, it is evident that many alternatives, modifications and variations would be or are apparent. Features of the disclosed embodiments can be combined, rearranged, omitted, etc. within the scope of the invention to produce additional embodiments. Accordingly, Applicants intend to embrace all such alternatives, modifications, equivalents and variations that are within the spirit and scope of this invention.

The invention claimed is:

1. A method for controlling heliostats, comprising:
accessing projection data representing reflection characteristics of each of a plurality of heliostats, each being aimable at a receiver;
for each of the plurality of heliostats, predicting a flux intensity projection pattern for each of multiple aiming points on the receiver responsively to the projection data respective to the each of the plurality of heliostats;
for each of a subset of the plurality of heliostats, selecting one of the multiple aiming points corresponding to the each of the subset responsively to previously selected aiming points corresponding to others of the plurality of heliostats, the selecting including applying at least one rule,
the at least one rule having the effect that when the selecting is repeated for all of the subset, a cumulative distribution of flux over the receiver surface is substantially uniform or substantially matches a predetermined pattern of flux; and
generating a control command responsively to the selecting to cause at least some of the plurality of heliostats to target the selected ones of the multiple aiming points.

2. The method of claim 1, wherein the at least one rule includes assigning a value to each of the multiple aiming points where the value corresponds to the degree to which a marginal contribution to a predicted cumulative distribution resulting from the selected aiming points corresponding to others of the plurality of heliostats reduces the smoothness of the predicted cumulative distribution.

3. The method of claim 1, further comprising defining an ordering of the plurality of heliostats responsively to the projection data.

4. The method of claim 1, further comprising defining an ordering of the plurality of heliostats responsively to the projection data, wherein the projection data includes parameters of a two-dimensional Gaussian.

5. The method of claim 1, wherein the selecting includes selecting one of the multiple aiming points for each of the subset at least every hour for a period of at least four hours per day for multiple consecutive days.

6. The method of claim 1, wherein the selecting includes selecting one of the multiple aiming points for each of the subset at least every half hour for a period of at least four hours per day for multiple consecutive days.

7. The method of claim 1, wherein the predicting a flux intensity is responsive at least to a predicted attenuation caused by dirt accumulation upon, or atmospheric particulates or aerosols between the receiver and, the each of the plurality of heliostats and/or a measured insolation rate received by the each of the plurality of heliostats.

8. The method of claim 1, wherein the at least one rule includes assigning a value to each of the multiple aiming points where the value corresponds to the degree to which a marginal contribution to a predicted cumulative distribution resulting from the selected aiming points corresponding to others of the plurality of heliostats increases a difference between the minimum and maximum of the predicted cumulative distribution.

9. The method of claim 1, wherein the at least one rule includes assigning a value to each of the multiple aiming points where the value corresponds to the degree to which a marginal contribution to a predicted cumulative distribution resulting from the selected aiming points corresponding to others of the plurality of heliostats produces a variation of the predicted cumulative distribution having a predefined shape.

10. The method of claim 1, wherein said reflection characteristics of each heliostat include a flux pattern of insolation reflected by the respective heliostat onto the receiver.

11. A method for controlling heliostats, comprising:
accessing projection data representing reflection characteristics of each of a plurality of heliostats, each being aimable at one or more receivers;
at a first time:
for each of the plurality of heliostats, for each of multiple aiming points, computing a metric indicating a contribution of the each of the plurality of heliostats to a distribution of flux over at least a portion of the one or more receivers;
for each of the plurality of heliostats, selecting a one of the aiming points responsively to the metric and responsively to a real time measured condition;
at a second time:
repeating the computing and selecting; and
generating a control command responsively to the selecting to cause at least some of the plurality of heliostats to target the selected ones of the multiple aiming points.

12. The method of claim 11, wherein the metric is responsive to a uniformity of flux cumulatively taken across a surface of the at least a portion.

13. The method of claim 11, wherein the metric is responsive to a predefined minimum flux cumulatively taken over an entirety of the at least a portion.

14. The method of claim 11, wherein the metric is responsive to a uniformity of flux cumulatively taken across a surface of the at least a portion, the uniformity being quantified responsively to a material of which the at least a portion is made.

15. The method of claim 11, wherein the metric is responsive to a quantity of reflected light from the each of the plurality that is predicted to miss the one or more receivers.

16. The method of claim 11, wherein said reflection characteristics of each heliostat include a flux pattern of insolation reflected by the respective heliostat onto the receiver.

17. The method of claim 11, wherein said real-time measured condition includes a temperature or flux state of the receiver.

18. The method of claim 11, wherein said real-time measured condition includes weather or insolation information.

19. The method of claim 11, further comprising:
at the first time, generating a control command responsively to the selecting at the first time to cause at least some of the plurality of heliostats to target the selected ones of the multiple aiming points,
wherein the generating a control command at the second time causes at least some of the plurality of heliostats to target a different aiming point than at the first time.

20. A control system for a concentrating solar collector system, comprising:
a controller programmed to access stored projection data representing reflection characteristics of each of a plurality of heliostats, each being aimable at a receiver;
the controller being programmed to, for each of the plurality of heliostats, calculate a predicted flux intensity projection pattern for each of multiple aiming points on the receiver responsively to the projection data respective to the each of the plurality of heliostats and, for each of a subset of the plurality of heliostats, to select one of the multiple aiming points corresponding to the each of the subset responsively to previously selected aiming points corresponding to others of the plurality of heliostats, by applying at least one rule;
the at least one rule having the effect that when the selecting is repeated for all of the subset, a cumulative distribution of flux over the receiver surface is substantially uniform or substantially matches a predetermined pattern of flux;
the controller configured to output a command to control the plurality of heliostats according to the aiming points selected by the controller.

21. The system of claim 20, wherein the at least one rule includes assigning a value to each of the multiple aiming points where the value corresponds to the degree to which a marginal contribution to a predicted cumulative distribution resulting from the selected aiming points corresponding to others of the plurality of heliostats reduces the smoothness of the predicted cumulative distribution.

22. The system of claim 20, wherein the selecting includes selecting one of the multiple aiming points for each of the subset at least every hour for a period of at least four hours per day for multiple consecutive days.

23. The system of claim 20, wherein the selecting includes selecting one of the multiple aiming points for each of the subset at least every half hour for a period of at least four hours per day for multiple consecutive days.

24. The system of claim 20, wherein the predicting a flux intensity is responsive at least to a predicted attenuation caused by dirt accumulation upon, or atmospheric particulates or aerosols between the receiver and, the each of the plurality of heliostats and/or a measured insolation rate received by the each of the plurality of heliostats.

25. The system of claim 20, wherein the at least one rule includes assigning a value to each of the multiple aiming points where the value corresponds to the degree to which a marginal contribution to a predicted cumulative distribution resulting from the selected aiming points corresponding to others of the plurality of heliostats increases a difference between the minimum and maximum of the predicted cumulative distribution.

26. The system of claim 20, wherein said reflection characteristics of each heliostat include a flux pattern of insolation reflected by the respective heliostat onto the receiver.

* * * * *